(12) United States Patent
Liang et al.

(10) Patent No.: US 11,374,299 B2
(45) Date of Patent: Jun. 28, 2022

(54) TRANSMISSION LINE CABLE INCLUDING AN UNBENDABLE SUPERIMPOSED LAYER PART AND A BENDABLE NON-SUPERIMPOSED LAYER PART

(71) Applicant: AAC Technologies Pte. Ltd., Singapore (SG)

(72) Inventors: Yue Liang, Shenzhen (CN); Yongli Chen, Shenzhen (CN); Jianan Wang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/990,948

(22) Filed: Aug. 11, 2020

(65) Prior Publication Data

US 2020/0411940 A1    Dec. 31, 2020

Related U.S. Application Data

(63) Continuation of application No. PCT/CN2019/093954, filed on Jun. 29, 2019.

(51) Int. Cl.
| | | |
|---|---|---|
| *H01P 3/08* | (2006.01) | |
| *H01P 3/02* | (2006.01) | |
| *H05K 1/02* | (2006.01) | |

(52) U.S. Cl.
CPC .............. *H01P 3/082* (2013.01); *H01P 3/026* (2013.01); *H05K 1/0278* (2013.01)

(58) Field of Classification Search
CPC ........ H01P 3/082; H01P 3/088; H05K 1/0278
USPC ........................................... 333/238
See application file for complete search history.

(56) References Cited

U.S. PATENT DOCUMENTS

| | | | | |
|---|---|---|---|---|
| 7,719,378 | B2 * | 5/2010 | Blair et al. ............. | H05K 1/147 333/1 |
| 9,692,100 | B2 * | 6/2017 | Baba et al. ............. | H01P 3/085 |
| 2012/0274423 | A1 * | 11/2012 | Kato ........................ | H01P 3/08 333/238 |
| 2014/0034366 | A1 * | 2/2014 | Otsubo et al. ....... | H05K 3/4691 174/254 |

* cited by examiner

*Primary Examiner* — Benny T Lee
(74) *Attorney, Agent, or Firm* — W&G Law Group

(57) ABSTRACT

The invention provides a transmission cable with a main baseline layer and a superimposed line layer. The main baseline layer includes a superimposed part, and a non-superimposed part. The superimposed line layer and the superimposed part form an unbendable part; the non-superimposed part forms a bendable par. The main baseline layer includes a first grounding layer, a first base layer stacked, a signal line layer, and a second base layer. The superimposed line layer includes a third base layer and a second grounding layer. The bendable part is small in thickness, so that the transmission cable provided by the invention has good bending performance, thereby improving the practicability of the transmission cable and prolonging the service life of the transmission cable.

7 Claims, 3 Drawing Sheets

US 11,374,299 B2

TRANSMISSION LINE CABLE INCLUDING AN UNBENDABLE SUPERIMPOSED LAYER PART AND A BENDABLE NON-SUPERIMPOSED LAYER PART

FIELD OF THE PRESENT DISCLOSURE

The invention relates to the field of electronic information and communication, in particular to a transmission cable.

DESCRIPTION OF RELATED ART

Due to thinness of consumer electronic devices, such as a mobile phone, a tablet computer and a notebook computer, a traditional method of transmitting a high-frequency signal by using a coaxial cable has become insufficient. A novel signal transmission cable for replacing the coaxial transmission cable to achieve signal transmission has become one of possible new application trends in the future.

In order to achieve impedance matching of the transmission cable, an antenna and other circuit modules, the signal transmission cable is usually manufactured in a multi-layer material laminating manner and has a certain thickness, and moreover, involves connection layers that are generally manufactured by metals and other conductive materials and are relatively high in hardness, so that the bending performance of the transmission cable is relatively poor.

Therefore, it is necessary to provide a transmission cable to solve the problem of poor bending performance of the existing transmission cable.

SUMMARY OF THE INVENTION

One of the main objects of the invention is to provide a transmission cable with improved bending performance.

In order to achieve the object mentioned, the invention provides a transmission cable, comprising: a superimposed line layer; a main baseline layer attached with the superimposed line layer, comprising a superimposed part on which the superimposed line layer is stacked, and a non-superimposed part on which no superimposed line layer is stacked; an unbendable part of the transmission cable formed by the superimposed line layer and the superimposed part; and a bendable part of the transmission cable formed by the non-superimposed part. The main baseline layer comprises a first grounding layer, a first base layer stacked at one side of the first grounding layer, a signal line layer stacked at one side of the first base layer opposite from the first grounding layer, and a second base layer stacked at one side of the signal line layer opposite from the first base layer. The superimposed line layer comprises a third base layer stacked at one side of the second base layer opposite from the signal line layer, and a second grounding layer stacked at one side of the third base layer opposite from the second base layer.

In addition, the signal line layer comprises an overlapping part on which the second base layer is stacked, and an extension part on which no second base layer is stacked.

In addition, the signal line layer comprises a plurality of grounding plates spaced from each other and a plurality of corresponding signal cables between every two adjacent grounding plates.

In addition, a sum of the thickness of the second base layer and the thickness of the third base layer is equal to a thickness of the first base layer.

In addition, the main baseline layer further comprises a first protective layer arranged at one side of the first grounding layer opposite from the first base layer; and the superimposed line layer further comprises a second protective layer stacked at one side of the second grounding layer opposite from the third base layer.

In addition, a length of the second protective layer is equal to a length of the second grounding layer, and is smaller than a length of the third base layer; and a length of the first protective layer is smaller than a length of the first grounding layer.

In addition, the transmission cable further comprises a plurality of spaced apart first grounding through holes arranged in the non-superimposed part, wherein the first grounding through holes pass through the first base layer and two ends thereof are electrically connected with the grounding plates of the signal line layer and the first grounding layer, respectively.

In addition, the transmission cable further comprises a plurality of spaced apart second grounding through holes arranged in the superimposed part, wherein the second grounding through holes sequentially pass through the first base layer, the signal line layer, the second base layer and the third base layer, and are electrically connected with the first grounding layer, the second grounding layer and the grounding plates of the signal line layer.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

The present disclosure will hereinafter be described in detail with reference to an exemplary embodiment. To make the technical problems to be solved, technical solutions and beneficial effects of the present disclosure more apparent, the present disclosure is described in further detail together with all the following figures and the embodiments. It should be understood the specific embodiment described hereby is only to explain the disclosure, but is not intended to limit the disclosure.

It should also be noted that when an element is referred to as being "fixed" or "disposed" on another element, the element may be directly on the other element or there may be intervening elements at the same time. When an element is called "connected" to another element, it may be directly placed connected to the other element or there may be intervening elements at the same time.

Figure 1:
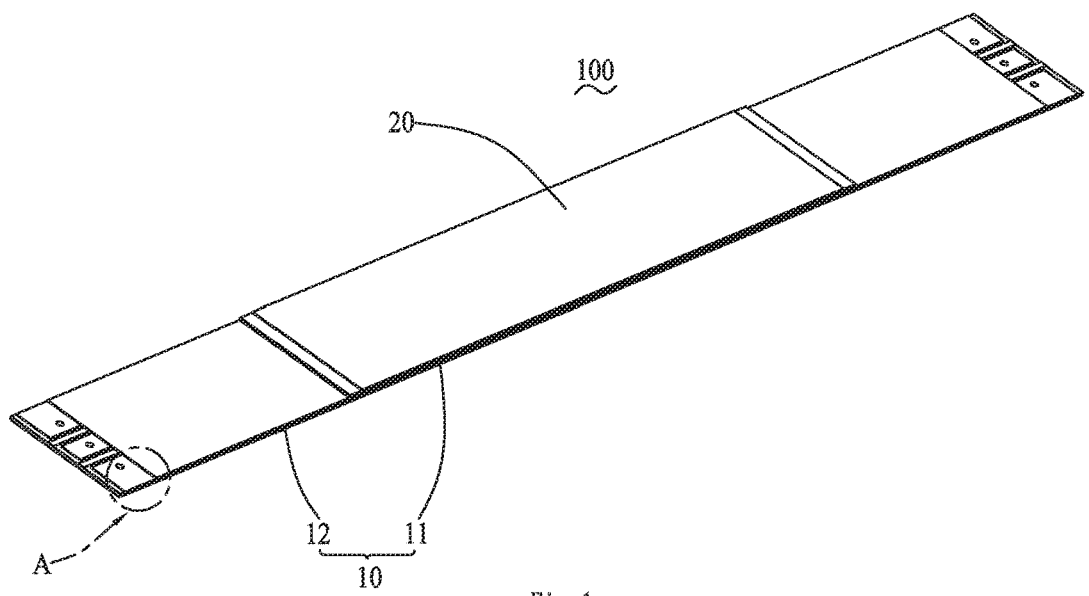
FIG. 1 is an isometric view of a transmission cable in accordance with an exemplary embodiment of the invention.
Figure 2:
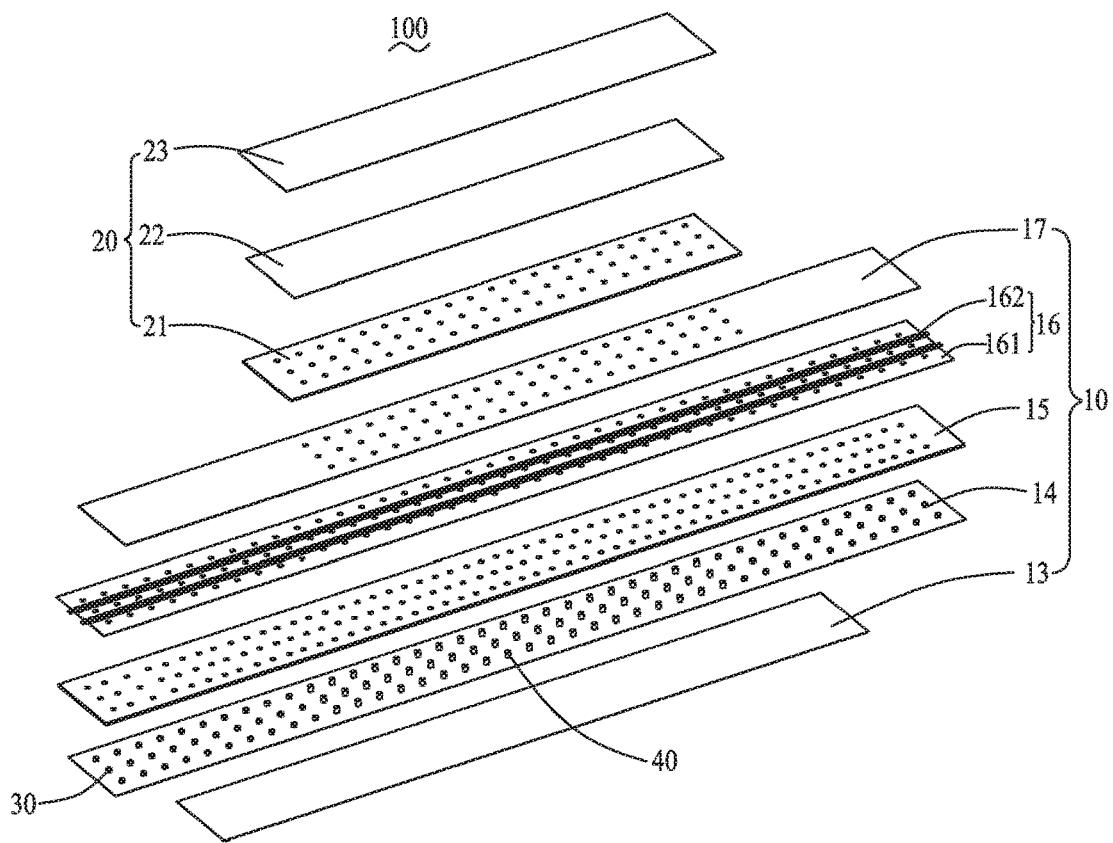
FIG. 2 is an exploded view of the transmission cable in FIG. 1.
Figure 5:
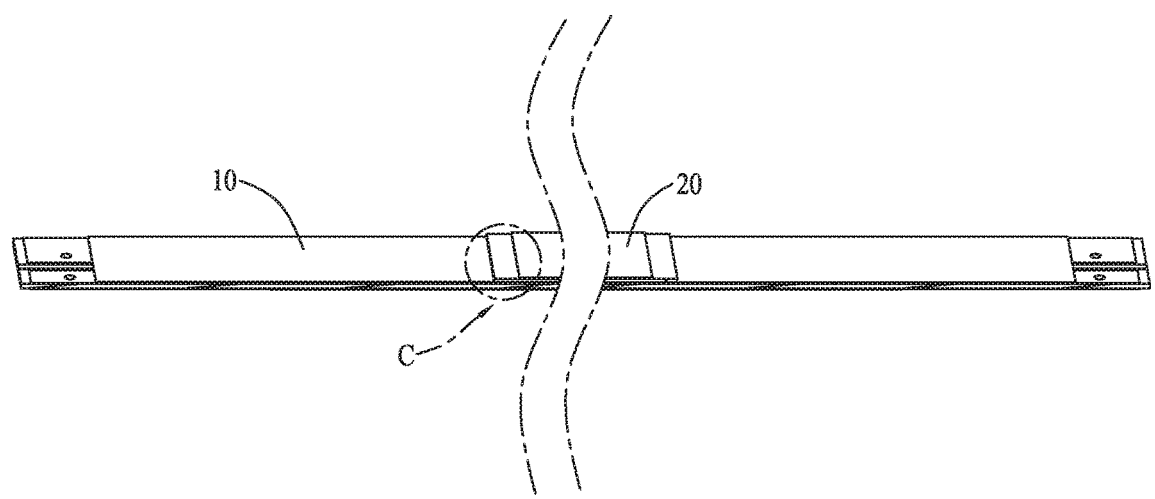
FIG. 5 is a cross-sectional view of the transmission cable taken along line B-B in FIG. 4.
Figure 6:
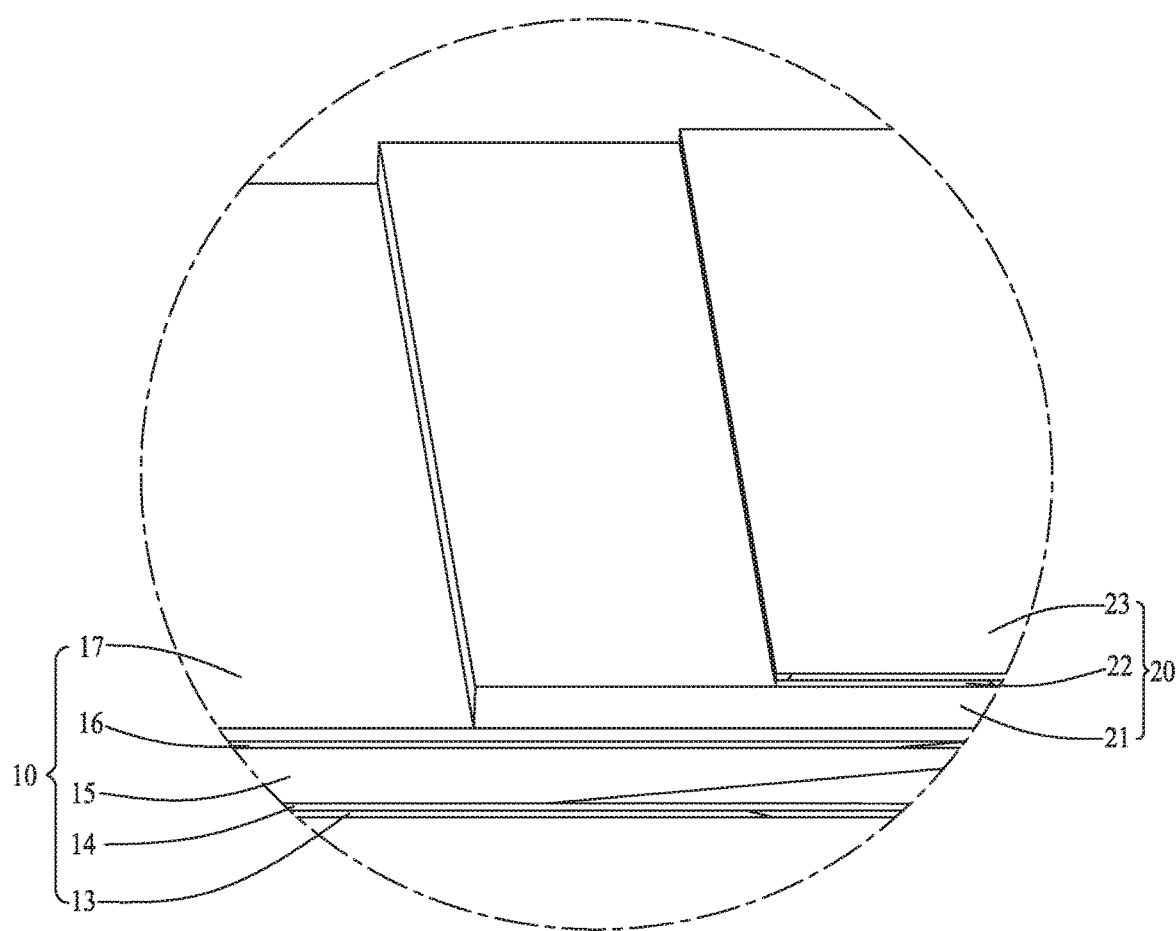
FIG. 6 is an enlarged view of Part C in FIG. 5.

Referring to FIG. 1, a transmission cable 100, provided by the embodiment of the invention, comprises a main baseline layer 10 also shown in FIGS. 2, 5 and 6) and a superimposed line layer 20 (also shown in FIGS. 2, 5 and 6) stacked at a local position of the main baseline layer 10 (also shown in FIGS. 2, 5 and 6). The main baseline layer 10 (also shown in FIGS. 2, 5 and 6) is provided with a superimposed part 11 on which the superimposed line layer 20 (also shown in FIGS. 2, 5 and 6) is stacked, and a non-superimposed part 12 on which the superimposed part 20 (also shown in FIGS. 2, 5 and 6) is not stacked. The superimposed line layer 20 (also shown in FIGS. 2, 5 and 6) and the superimposed part 11 form an unbendable part of the transmission cable 100. The non-superimposed part 12 forms a bendable part of the transmission cable 100 and the thickness of the bendable part is relatively small. Therefore, the transmission cable has relatively good bendability; the practicability of the transmission cable 100 is improved; and the service life thereof is prolonged.

Figure 3:
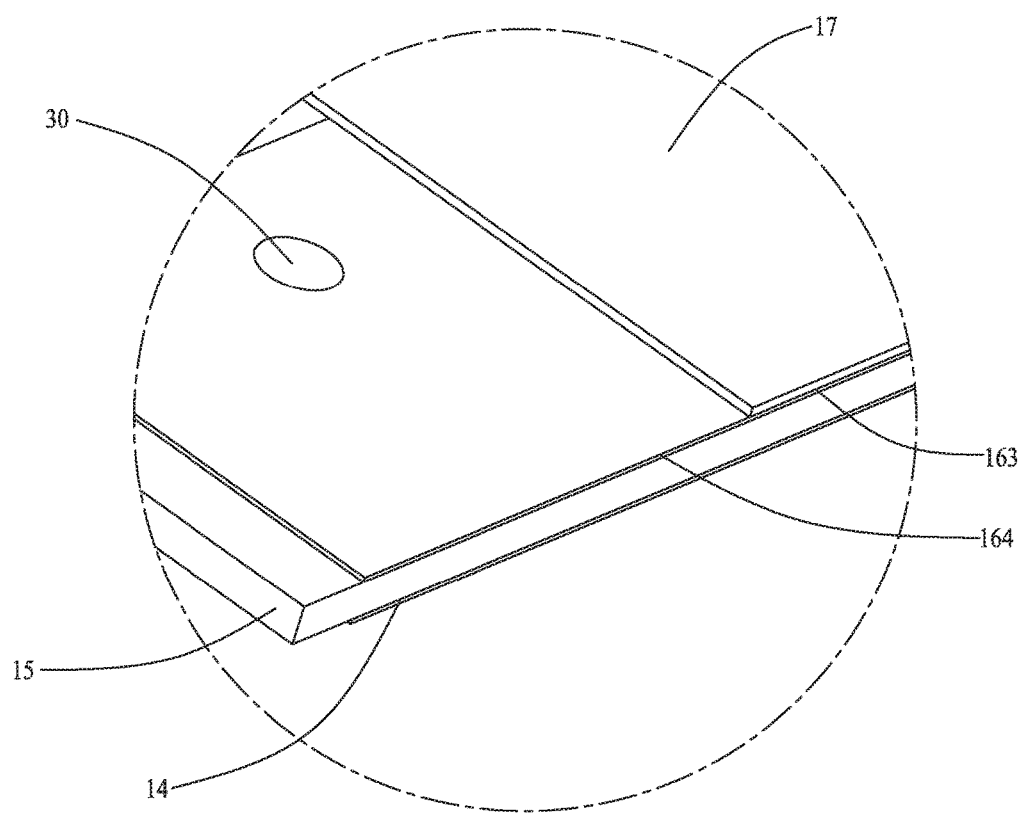
FIG. 3 is a partially enlarged view of Part A in FIG. 1.
Figure 4:
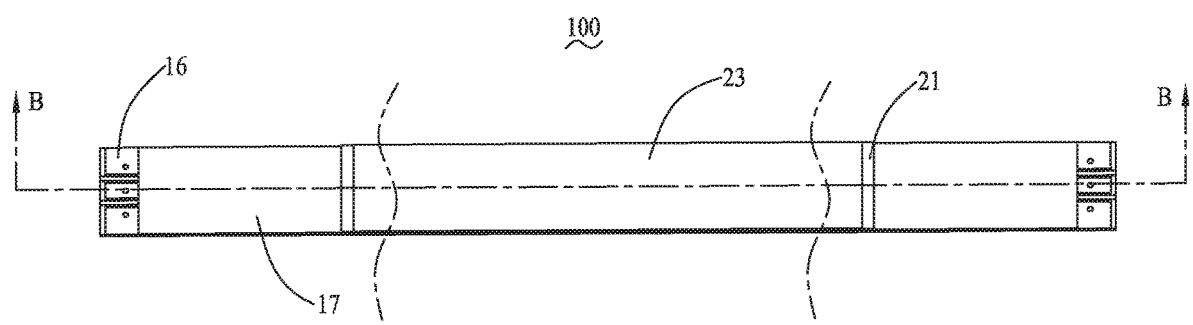
FIG. 4 is similar to FIG. 1, but from another aspect.

Referring to FIG. 6, the main baseline layer 10 (also shown in FIGS. 1, 2 and 5) comprises a first protective layer 13 (also shown in FIG. 2), a first grounding layer 14 (also shown in FIGS. 2 and 3) stacked on the first protective layer 13 also shown in FIG. 2), a first base layer 15 (also shown in FIGS. 2 and 3) stacked on the first grounding layer 14 also shown in FIGS. 2 and 3), a signal line layer 16 also shown in FIGS. 2 and 4) stacked on the first base layer 15 (also shown in FIGS. 2 and 3), and a second base layer 17 (also shown in FIGS. 2, 3 and 4) stacked on the signal line layer 16 also shown in FIGS. 2 and 4). The superimposed line layer 20 (also shown in FIGS. 1, 2 and 5) comprises a third base layer 21 (also shown in FIGS. 2 and 4), a second grounding layer 22 (also shown in FIG. 2) stacked on the third base layer 21 (also shown in FIGS. 2 and 4) and a second protective layer 23 (also shown in FIGS. 2 and 4) stacked on the second grounding layer 22 (also shown in FIG. 2). The third base layer 21 also shown in FIGS. 2 and 4) is stacked on the second base layer 17 also shown in FIGS. 2, 3 and 4). The thicknesses and material properties of the first base layer 15 also shown in FIGS. 2 and 3), the second base layer 17 also shown in FIGS. 2, 3 and 4) and the third base layer 21 (also shown in FIGS. 2 and 4) largely determine performance indexes of the whole transmission cable 100. In general, preferably, the first base layer the second base layer and the third base layer are made of materials with relatively small dielectric constant and loss factor. Moreover, in the embodiment, the sum of the thickness of the second base layer 17 (also shown in FIGS. 2, 3 and 4) and the thickness of the third base layer 21 also shown in FIGS. 2 and 4) is equal to the thickness of the first base layer 15 also shown in FIGS. 2 and 3). It will be understood that the first base layer 15 (also shown in FIGS. 2 and 3), the second base layer 17 (also shown in FIGS. 2, 3 and 4) and the third base layer 21 (also shown in FIGS. 2 and 4) can be set into different thicknesses according to the thickness requirements in an actual manufacturing process.

Referring to FIG. 2, the length of the first protective layer 13 (also shown in FIG. 6) is smaller than that of the first grounding layer 14 (also shown in FIGS. 3 and 6); and the length of the second protective layer 23 (also shown in FIGS. 4 and 6) is equal to that of the second grounding layer 22 also shown in FIG. 6) and smaller than that of the third base layer 21 also shown in FIGS. 4 and 6). The first protective layer 14 also shown in FIGS. 3 and 6) and the second protective layer 23 also shown in FIGS. 4 and 6) have solder resist and insulation functions, can prevent internal metals from being oxidized, and also can avoid the problems, such as a short circuit, caused by the contact of the transmission cable 100 and an external conductor.

Referring to FIG. 2, the signal line layer 16 also shown in FIGS. 4 and 6) comprises a plurality of grounding plates 161 arranged at intervals and signal cables 162 between every two adjacent grounding plates 161. In the embodiment, the number of the grounding plates 161 is preferably 3, but is not limited to 3, and the three grounding plates 161 are arranged at intervals and one signal cable 162 is arranged between every two adjacent grounding plates 161. The grounding plates 161 and the signal cables 162 both are located in the same plane, so that an additional conductive blind hole is not required to connect various signal cables 162, and the problem that the transmission cable 100 cannot transmit due to a fracture of the conductive blind hole is avoided. Moreover, a manufacturing process for the conductive blind hole is relatively complicated, the cost is relatively high, and the conductive blind hole has a great influence on the performance of the transmission cable 100, so that the cost is reduced under the condition of not requiring the conductive blind hole, a transmission loss of a signal is also greatly reduced, and the reliability of the transmission cable 100 is improved.

Referring to FIG. 2, the signal cables 162 on the unbendable part, the first grounding layer 14 (also shown in FIGS. 3 and 6) and the second grounding layer 22 (also shown in FIG. 6) form a strip line structure. The signal cables 162 on the bendable part and the grounding plates 161 at two sides thereof form a coplanar waveguide structure. Referring to FIG. 2, the signal line layer 16 also shown in FIGS. 4 and 6) comprises an overlapping part 163 on which the second base layer 17 (also shown in FIGS. 3, 4 and 6) is stacked, and an extension part 164 on which the second base layer 17 (also shown in FIGS. 3, 4 and 6) is not stacked. Referring to FIG. 2, the grounding plates 161 and two ends of the signal cables 162 extend out of the second base layer 17 (also shown in FIGS. 3, 4 and 6) respectively, and the outer end part of the coplanar waveguide structure is not covered with the second base layer 17 also shown in FIGS. 3, 4 and 6), so that the signal cables can serve as test windows to facilitate performance testing of the transmission cable 100.

Referring to FIG. 2, the transmission cable 100 further comprises a plurality of first grounding through holes 30 also shown in FIG. 3) and second grounding through holes 40 arranged at intervals. The first grounding through holes 30 (also shown in FIG. 3) are positioned in the non-superimposed part 12 (shown in FIG. 1). The second grounding through holes 40 are positioned in the superimposed part 11 (shown in FIG. 1). The lengths of the first grounding through holes 30 (also shown in FIG. 3) are smaller than those of the second grounding through holes 40, and both the first grounding through holes and the second grounding through holes are vertically connected with the first grounding layer 14 also shown in FIGS. 3 and 6). The first grounding through holes 30 also shown in FIG. 3) pass through the first base layer 15 (also shown in FIGS. 3 and 6) and two ends are electrically connected with the first grounding layer 14 (also shown in FIGS. 3 and 6) and the grounding plates 161 of the signal line layer 16 (also shown in FIGS. 4 and 6) respectively. The second grounding through holes 40 sequentially pass through the first base layer 15 (also shown in FIGS. 3 and 6), the signal line layer 16 (also shown in FIGS. 4 and 6), the second base layer 17 also shown in FIGS. 3, 4 and 6) and the third base layer 21 (also shown in FIGS. 4 and 6), and are electrically connected with the first grounding layer 14 (also shown in FIGS. 3 and 6), the second grounding layer 22 also shown in FIG. 6) and the grounding plates 161 of the signal line layer 16 (also shown in FIGS. 4 and 6).

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A transmission cable, comprising:
a superimposed line layer;
a main baseline layer attached with the superimposed line layer, comprising a superimposed part on which the superimposed line layer is stacked, and a non-superimposed part on which no superimposed line layer is stacked;
an unbendable part of the transmission cable formed by the superimposed line layer and the superimposed part;
a bendable part of the transmission cable formed by the non-superimposed part; wherein
the main baseline layer comprises a first grounding layer, a first base layer stacked at one side of the first grounding layer, a signal line layer stacked at one side of the first base layer opposite from the first grounding layer, and a second base layer stacked at one side of the signal line layer opposite from the first base layer;
the superimposed line layer comprises a third base layer stacked at one side of the second base layer opposite from the signal line layer, and a second grounding layer stacked at one side of the third base layer opposite from the second base layer;
the signal line layer comprises an overlapping part on which the second base layer is stacked, and an extension part on which the second base layer is not stacked.

2. The transmission cable as described in claim 1, wherein the main baseline layer further comprises a first protective layer arranged at one side of the first grounding layer opposite from the first base layer; and the superimposed line layer further comprises a second protective layer stacked at one side of the second grounding layer opposite from the third base layer.

3. The transmission cable as described in claim 2, wherein a length of the second protective layer is equal to a length of the second grounding layer, and is smaller than a length of the third base layer; and a length of the first protective layer is smaller than a length of the first grounding layer.

4. The transmission cable as described in claim 1, wherein a sum of the thickness of the second base layer and the thickness of the third base layer is equal to a thickness of the first base layer.

5. The transmission cable as described in claim 1, wherein the signal line layer comprises a plurality of grounding plates spaced from each other and a plurality of corresponding signal cables between every two adjacent grounding plates.

6. The transmission cable as described in claim 5, further comprising a plurality of spaced second grounding through holes arranged in the superimposed part, wherein the plurality of spaced second grounding through holes sequentially pass through the first base layer, the signal line layer, the second base layer and the third base layer, and are electrically connected with the first grounding layer, the second grounding layer and the grounding plates of the signal line layer.

7. The transmission cable as described in claim 5, further comprising a spaced plurality of first grounding through holes arranged in the non-superimposed part, wherein the plurality of first grounding through holes pass through the first base layer and two ends thereof are electrically connected with the grounding plates of the signal line layer and the first grounding layer respectively.

* * * * *